United States Patent
Fang et al.

(10) Patent No.: US 9,241,406 B2
(45) Date of Patent: Jan. 19, 2016

(54) ELECTRONIC ASSEMBLY

(71) Applicant: AU Optronics Corp., Hsin-Chu (TW)

(72) Inventors: Yan-Li Fang, Hsin-Chu (TW); Po-Fu Huang, Hsin-Chu (TW); Chun-Ming Lin, Hsin-Chu (TW)

(73) Assignee: AU OPTRONICS CORP., Hsin-Chu (TW)

( * ) Notice: Subject to any disclaimer, the term of this patent is extended or adjusted under 35 U.S.C. 154(b) by 187 days.

(21) Appl. No.: 13/938,741

(22) Filed: Jul. 10, 2013

(65) Prior Publication Data

US 2014/0104794 A1  Apr. 17, 2014

(30) Foreign Application Priority Data

Oct. 12, 2012  (TW) .............................. 101137804 A

(51) Int. Cl.
*H05K 7/10* (2006.01)
*G02F 1/1345* (2006.01)
(Continued)

(52) U.S. Cl.
CPC .............. *H05K 1/112* (2013.01); *G02F 1/1345* (2013.01); *G02F 1/13458* (2013.01); *H05K 1/0277* (2013.01); *H05K 3/244* (2013.01); *H05K 3/361* (2013.01); *H05K 3/365* (2013.01); *H05K 3/368* (2013.01); *H05K 3/4007* (2013.01); *H05K 3/4015* (2013.01); *H05K 3/4038* (2013.01); *H05K 3/4046* (2013.01);
(Continued)

(58) Field of Classification Search
CPC . G02F 1/1343; G02F 1/1345; G02F 1/13452; G02F 1/13458; H05K 3/361; H05K 3/365; H05K 3/368; H05K 3/4007; H05K 3/4015; H05K 3/4038; H05K 3/4046; H05K 3/4053; H05K 3/4076

USPC ......... 361/748, 749, 767, 772, 773, 774, 777; 349/149, 150, 151, 152
See application file for complete search history.

(56) References Cited

U.S. PATENT DOCUMENTS

| 2011/0032687 | A1* | 2/2011 | Song ............................ 361/803 |
| 2012/0299888 | A1* | 11/2012 | Kim et al. ..................... 345/205 |
| 2013/0082984 | A1* | 4/2013 | Drzaic et al. ................. 345/204 |

FOREIGN PATENT DOCUMENTS

| CN | 101996531 A | 3/2011 |
| CN | 102214619 A | 10/2011 |

(Continued)

OTHER PUBLICATIONS

State Intellectual Property Office of the People's Republic of China, "Office Action", China, Dec. 16, 2014.
(Continued)

*Primary Examiner* — Hoa C Nguyen
*Assistant Examiner* — Binh Tran
(74) *Attorney, Agent, or Firm* — Locke Lord LLP; Tim Tingkang Xia, Esq.

(57) ABSTRACT

An electronic assembly includes a first substrate, at least one first conductive pad and multiple second conductive pads. The first substrate comprises a base layer and at least one conductive circuit layer. The at least one conductive circuit layer is disposed on the base layer. The at least one first conductive pad is disposed on the first substrate. The first conductive pad is electrically insulated from the conductive circuit layer. The first conductive pad includes multiple first holes. The second conductive pads are disposed on the first substrate. The second conductive pads are electrically connected to the conductive circuit layer.

9 Claims, 4 Drawing Sheets

(51) Int. Cl.
    *H05K 1/11*     (2006.01)
    *H05K 1/02*     (2006.01)
    *H05K 3/36*     (2006.01)
    *H05K 3/40*     (2006.01)
    *H05K 3/24*     (2006.01)
    *H01R 9/00*     (2006.01)
    *H05K 7/00*     (2006.01)
    *H05K 1/00*     (2006.01)
    *H05K 1/18*     (2006.01)
    *H05K 3/32*     (2006.01)

(52) U.S. Cl.
    CPC ........... *H05K 3/4053* (2013.01); *H05K 3/4076* (2013.01); *H05K 1/111* (2013.01); *H05K 1/189* (2013.01); *H05K 3/323* (2013.01); *H05K 2201/0969* (2013.01); *H05K 2201/10128* (2013.01)

(56) References Cited

FOREIGN PATENT DOCUMENTS

TW     533522 B     5/2003
TW     200535761     11/2005

OTHER PUBLICATIONS

Intellectual Property Office, Ministry of Economic Affairs, R.O.C., "Office Action", May 22, 2014, Taiwan.

* cited by examiner

1

ELECTRONIC ASSEMBLY

CROSS-REFERENCE TO RELATED APPLICATIONS

This non-provisional application claims priority under 35 U.S.C. §119(a) on Patent Application No(s). 101137804 filed in Taiwan, R.O.C. on Oct. 12, 2012, the entire contents of which are hereby incorporated by reference.

BACKGROUND

1. Technical Field

The disclosure relates to an electronic assembly, and more particularly to an electronic assembly including a substrate with a conductive pad.

2. Related Art

With the rapid improvement of multi-media society, liquid crystal displays (LCD) are generally applied to intermediate or compact portable televisions, video mobile phones, camcorders, laptop computers, desktop display devices, tablet computers or projection televisions.

The LCD comprises a display module. The display module comprises a display panel and a circuit board. The circuit board is connected to the display panel. The circuit board is electrically connected to the display panel by a lapping joint. In detail, multiple conductive pads, disposed on the circuit board, have multiple gold foil layers. Moreover, a conductive film is disposed on the conductive layer, and the circuit board is joined with a flex printed connecting unit of the display through the conductive film. In practical, only a part of the conductive pads, disposed on the circuit board, are electrically connected to a circuit layer of the circuit board. Other conductive pads, which are not electrically connected to the circuit layer, are called dummy pads. However, with the rise of gold prices, the dummy pads with the gold foil layer may increase unnecessary costs.

Therefore, the circuit board without the dummy pads has been designed. However, when the conductive film is adhered on the circuit board, a height difference is formed in the display modules between the area where the dummy pads have been removed and the area with the conductive pads. In this way, the adherence of the conductive film is not secure, which causes defective manufacturing of the circuit board and the flex printed connecting unit.

SUMMARY

The disclosure provides an electronic assembly comprising a first substrate, at least one first conductive pad and a plurality of second conductive pads. The first substrate comprises a base layer and at least one conductive circuit layer. The at least one conductive circuit layer is disposed on the base layer. The at least one first conductive pad is disposed on the first substrate. The first conductive pad is electrically insulated from the conductive circuit layer. The first conductive pad includes a plurality of first holes. The second conductive pads are disposed on the first substrate. The second conductive pads are electrically connected to the conductive circuit layer.

BRIEF DESCRIPTION OF THE DRAWINGS

The disclosure will become more fully understood from the detailed description given herein below for illustration only, and thus are not limitative of the disclosure, and wherein.

DETAILED DESCRIPTION

The detailed features and advantages of the disclosure are described below in great detail through the following embodiments, the content of the detailed description is sufficient for those skilled in the art to understand the technical content of this disclosure and to implement the disclosure there accordingly. Based upon the content of the specification, the claims, and the drawings, those skilled in the art can easily understand the relevant objectives and advantages of the disclosure.

Figure 1A:
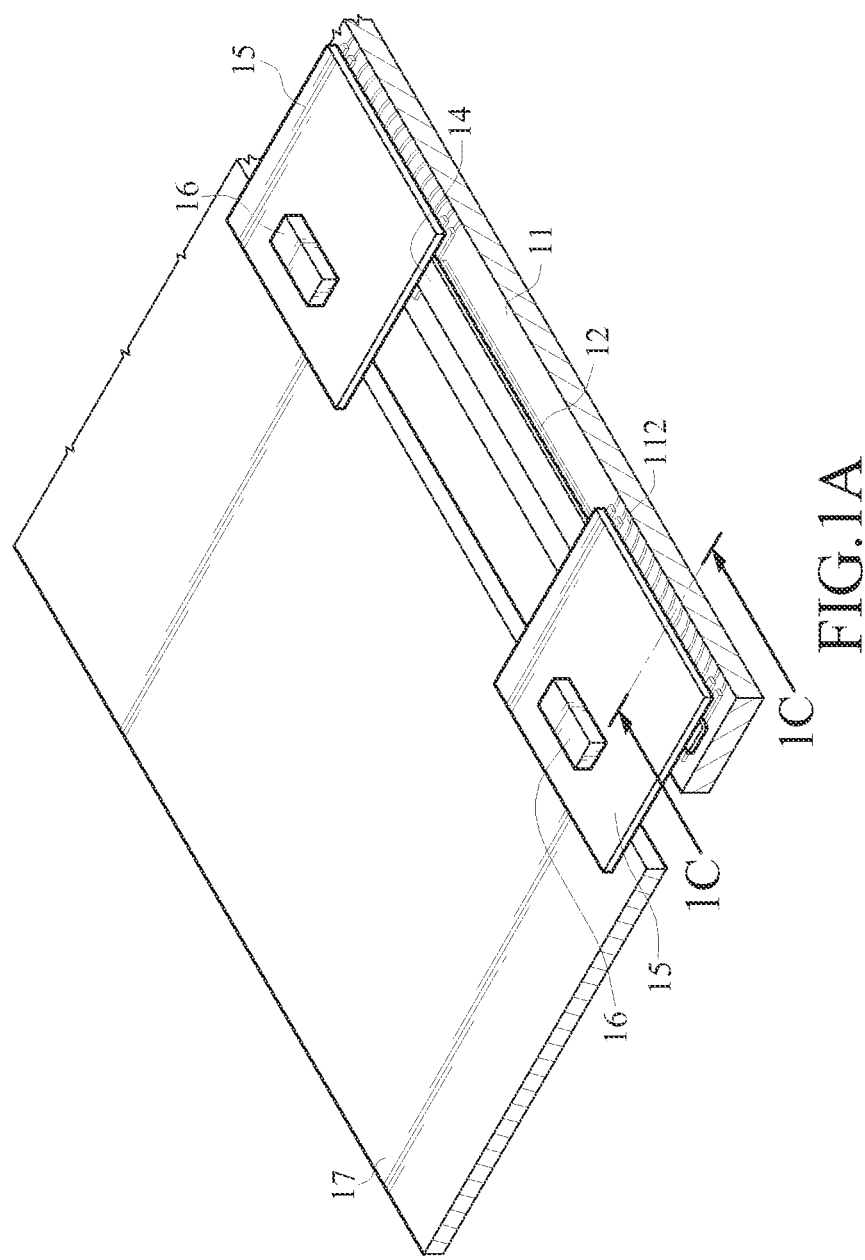
FIG. 1A is a schematic view of an electronic assembly according to a first embodiment of the disclosure.
Figure 1B:
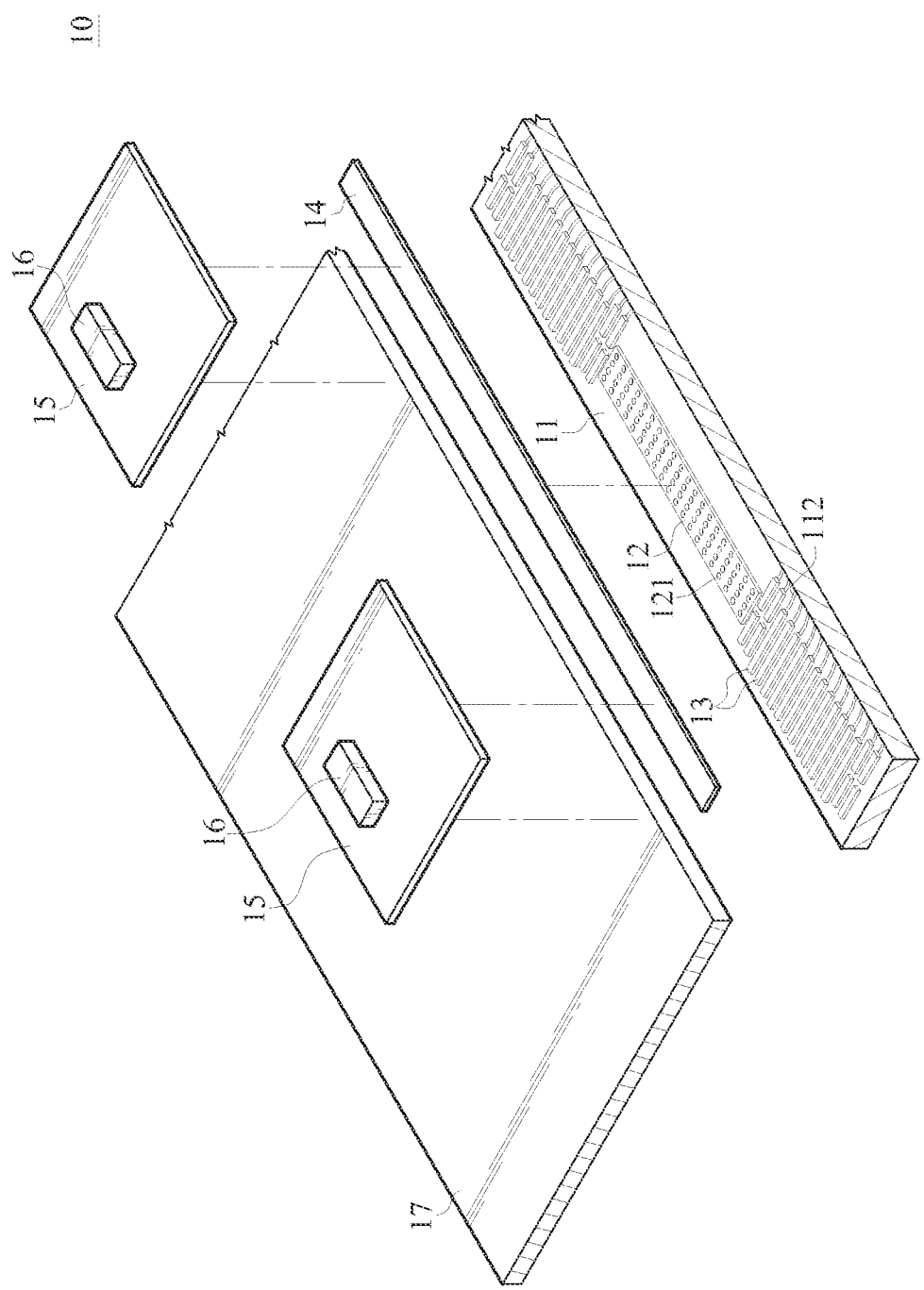
FIG. 1B is a schematic exploded view of the electronic assembly of FIG. 1A.
Figure 1C:
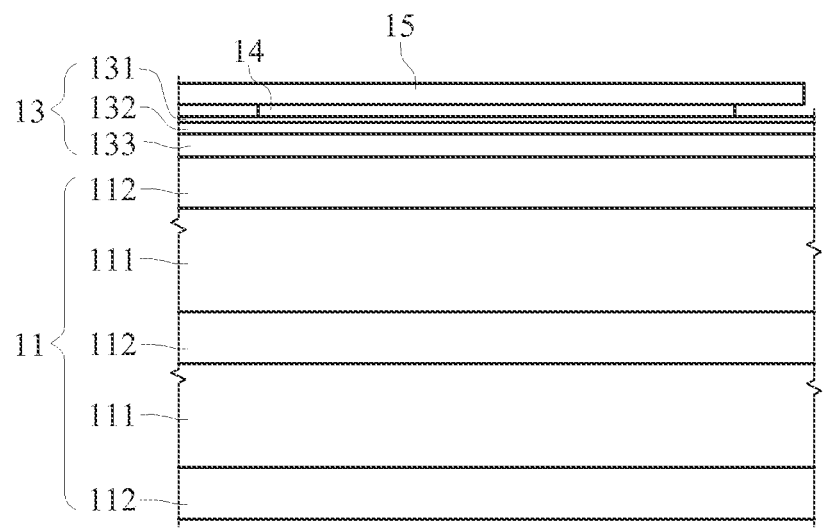
FIG. 1C is a cross-sectional view along a line 1C-1C of FIG. 1A.
Figure 2A:
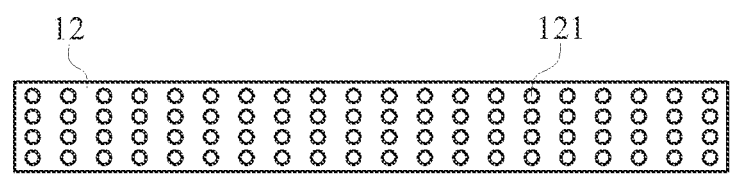
FIG. 2A is a schematic top view of a first conductive pad of FIG. 1B.

Please refer to FIGS. 1A to 2A. FIG. 1A is a schematic view of an electronic assembly according to a first embodiment of the disclosure. FIG. 1B is a schematic exploded view of the electronic assembly of FIG. 1A. FIG. 1C is a cross-sectional view along a line 1C-1C of FIG. 1A. FIG. 2A is a schematic top view of a first conductive pad of FIG. 1B.

In this embodiment, an electronic assembly 10 is a display module of a tablet computer or a LCD monitor, but not limited to the disclosure. The electronic assembly 10 comprises a first substrate 11, at least one first conductive pad 12 and multiple second conductive pads 13. The first conductive pad 12 and the second conductive pads 13 are disposed on the first substrate 11.

In this embodiment, the first substrate 11 is a printed circuit board (PCB), but not limited to the disclosure. The first substrate 11 comprises at least one base layer 111 and at least one conductive circuit layer 112. The conductive circuit layer 112 is separately disposed on the base layer 111. The conductive circuit layer 112 may be electrically connected to multiple electronic components (not shown, e.g. capacitor, resistance, inductance) of the first substrate 11.

In this embodiment, the first substrate 11 comprises the multiple base layers 111 and the multiple conductive circuit layers 112. These base layers 111 and these conductive circuit layers 112 are alternatively stacked on top of each other. The material of the above-mentioned base layer 111 is glass fiber, but not limited to the disclosure. The material of the above-mentioned conductive circuit layer 112 is copper, but not limited to the disclosure. Moreover, the first substrate 11 comprising the multiple base layers 111 and the multiple conductive circuit layers 112 is exemplary, and the number of the base layers 111 and that of the conductive circuit layers 112 are not limited to the disclosure. For example, in other embodiments, the first substrate may only comprise the single base layer and the single conductive circuit layer which is separately disposed on the single base layer.

The first conductive pad 12 is disposed on the first substrate 11, and the first conductive pad 12 is electrically insulated from the conductive circuit layer 112. In other embodiments, the first conductive pad 12 and the conductive circuit layer 112 may be disposed on the same layer, but not limited to the disclosure. Therefore, in this embodiment, because the first conductive pad 12 is not electrically connected to the electronic component of the first substrate 11, the first conductive pad 12 is called a dummy pad of the first substrate 11. However, the number of the first conductive pad 12 is only exemplary, and the number of the first conductive pad 12 is not limited to the disclosure.

Figure 2B:
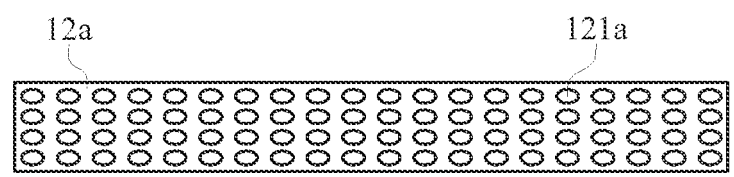
FIG. 2B is a schematic top view of a first conductive pad according to another embodiment of the disclosure.
Figure 2C:
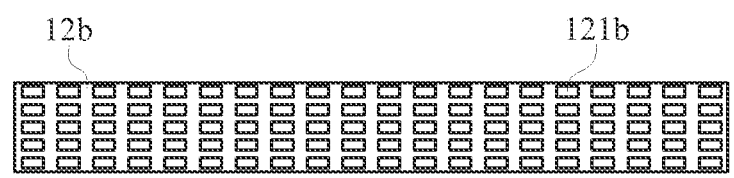
FIG. 2C is a schematic top view of a first conductive pad according to yet another embodiment of the disclosure.

The shape of the first conductive pad 12 is rectangular, but not limited to the disclosure. Also, the first conductive pad 12 includes multiple first holes 121. The first holes 121 may be disposed separately in a matrix manner or be disposed randomly, but not limited to the disclosure. In this embodiment, the shapes of the first holes 121 are right circular cylindrical, as shown in FIG. 2A, but not limited to the disclosure. For example, the shapes of first holes 121a on the first conductive pad 12a are oval cylindrical, as shown in FIG. 2B, which is a schematic top view of a first conductive pad according to another embodiment of the disclosure. Or, in other embodiments, the shapes of first holes 121b on the first conductive pad 12b are rectangular, as shown in FIG. 2C, which is a schematic top view of a first conductive pad according to yet another embodiment of the disclosure. Or, in other embodiments, the shapes of first holes 121b on the first conductive pad 12b are irregular.

In this embodiment, the multiple second conductive pads 13 are disposed on the first substrate 11, and the second conductive pads 13 are electrically connected to the conductive circuit layer 112 such that the second conductive pads 13 are in electrical connection with the electronic components on the first substrate 11.

Furthermore, in this embodiment, referring to FIG. 1C, each of the second conductive pads 13 comprises a copper layer 133, a nickel layer 132 and a gold layer 131. The copper layer 133, the nickel layer 132 and the gold layer 131 are stacked in sequence on the conductive circuit layer 112 with the gold layer 131 being on the top and the copper layer 133 on the bottom. In other embodiments, the copper layer 133 and the conductive circuit layer 112 are disposed on the same layer, but not limited to the disclosure. The copper layer 133, the nickel layer 132 and the gold layer 131 may be formed on the first substrate 11 by printing, electroplating, electrophoresis or plasma enhanced deposition (PED). Moreover, in this embodiment, the material of the first conductive pad 12 may be the same as the second conductive pads 13. In other words, the first conductive pad 12 may comprise the copper layer, the nickel layer and the gold layer stacked with each other.

According to the above description, both the first conductive pad 12 and the second conductive pads 13 comprise the gold layer. under the circumstances that when the thickness of the first conductive pad 12 is the same as the second conductive pads 13, reducing the area of the first conductive pad 12 or that of the second conductive pad 13 may also reduce the usage of the gold, which lowers the cost of the electronic assembly 10. Therefore, by disposing the multiple first holes 121 on first conductive pad 12 to reduce the whole area of the first conductive pad 12, the usage of the gold for the first conductive pad 12 is reduced accordingly. Furthermore, the first conductive pad 12 is the dummy pad so as not to provide the effect of electrical connection, and therefore the disposing of the first holes 121 does not affect the quality of the electrical connection of the electronic assembly 10.

Moreover, in this embodiment, the electronic assembly 10 may further comprise a conductive film layer 14. The conductive film layer 14 may be an anisotropic conductive film (ACF). The conductive film layer 14 is disposed on both the first conductive pad 12 and the second conductive pads 13.

Figure 3:
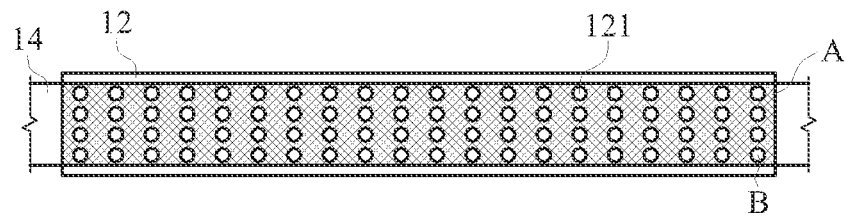
FIG. 3 is a schematic stacked view of the first conductive pad and the conductive film layer of FIG. 1B.

Please refer to FIG. 3, which is a schematic stacked view of the first conductive pad and the conductive film layer of FIG. 1B. The contact area between the conductive film layer 14 and the first conductive pad 12 is A (i.e. cross-line area), and the area which the conductive film layer 14 is positioned on the first holes 121 is B. The electronic assembly 10 satisfies: 33%≤A/(A+B)≤60%. When the value A/(A+B) is lesser, it indicates that the area of the first conductive pad 12 per unit area is lesser such that the usage of the gold for the first conductive pad 12 will also be lesser. Therefore, in some embodiments, the electronic assembly 10 further satisfies: 33%≤A/(A+B)≤45%, which reduces the usage of the gold for the first conductive pad 12, thereby effectively lowering the cost of the electronic assembly 10. Furthermore, the reduction of the usage of gold is applied by disposing the first hole 121 on the first conductive pad 12 rather than not disposing the whole first conductive pad 12. Thus, when the conductive film layer 14 is disposed on both the first conductive pad 12 and the second conductive pads 13, the problem of height differences between the conductive film layer 14 and the conductive pad 12 as well as between the conductive film layer 14 and the second conductive pads 13 are avoided, which prevents the conductive film layer 14 from poor adherence.

Furthermore, in this embodiment, the electronic assembly 10 may further comprise a second substrate 15 and a chip 16. The second substrate 15 may be a flex printed circuit (FPC), and the chip 16 may be disposed on the second substrate 15 in a chip on film (COF) manner. Moreover, the second substrate 15 is stacked on the conductive film layer 14 such that the conductive circuit layer 112 of the first substrate 11 is electrically connected to the second substrate 15 and the chip 16 via the conductive film layer 14 and the second conductive pad 13.

Moreover, in this embodiment, the electronic assembly 10 may further comprise a display panel 17. The display panel 17 may be a liquid crystal display panel, but not limited to the disclosure. The display panel 17 is connected to an end of the second substrate 15 further away from the first substrate 11.

Figure 4:
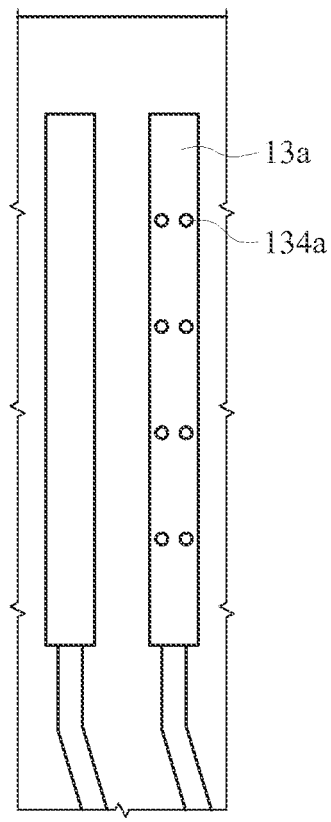
FIG. 4 is a schematic top view of a second conductive pad according to still another embodiment of the disclosure.

Please refer to FIG. 4, which is a schematic top view of a second conductive pad according to still another embodiment of the disclosure. In other embodiments, in order to reduce the total usage of gold for the electronic assembly 10, multiple second holes 134a are disposed on at least one second conductive pad 13a. Only the number and the size of the second holes 134a on the second conductive pad 13a are adjusted properly, the effect of the reduction of the usage of the gold may also be achieved without affecting the electrical connection of the second conductive pad 13a.

In the electronic assembly according to the above-mentioned embodiment of the disclosure, the multiple first holes are disposed on the first conductive pad (dummy pad), which reduces the area of the first conductive pad, thereby reducing the usage of the gold for the first conductive pad. Therefore, the cost of the electronic assembly may be lowered. Furthermore, the first conductive pad is still provided in the disclosure such that the height difference generated by disposing the conductive film layer on the substrate is avoided, which prevents the conductive film layer from poor adherence.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to activate others skilled in the art to utilize the disclosure and various embodiments and with various modifications as are suited to the particular use contemplated. Alternative embodiments will become apparent to those skilled in the art to which the disclosure pertains without departing from its spirit and scope. Accordingly, the scope of the disclosure is defined by the appended claims rather than the foregoing description and the exemplary embodiments described therein.

What is claimed is:

1. An electronic assembly, comprising:
a first substrate comprising a base layer and at least one conductive circuit layer disposed on the base layer;
at least one first conductive pad disposed on the first substrate, the first conductive pad being electrically insulated from the conductive circuit layer, and the first conductive pad having a plurality of first holes;
a plurality of second conductive pads disposed on the first substrate, and the second conductive pads being electrically connected to the conductive circuit layer; and
a conductive film layer disposed on both the first conductive pad and the second conductive pads, wherein a contact area between the conductive film layer and the first conductive pad is A, an area which the conductive film layer is positioned on the first holes is B, and the electronic assembly satisfies $33\% \leq A/(A+B) \leq 45\%$.

2. The electronic assembly according to claim 1, further comprising a second substrate and a chip, wherein a portion of the second substrate is disposed on the conductive film layer, and the chip is disposed on the second substrate.

3. The electronic assembly according to claim 2, wherein the second substrate is a flex printed circuit board.

4. The electronic assembly according to claim 2, further comprising a display panel connected to an end of the second substrate farther away from the first substrate.

5. The electronic assembly according to claim 1, wherein at least one of the second conductive pads has a plurality of second holes.

6. The electronic assembly according to claim 1, wherein the shapes of the first holes are right circular cylindrical, oval cylindrical, rectangular or irregular.

7. The electronic assembly according to claim 1, wherein the first substrate is a printed circuit board.

8. The electronic assembly according to claim 1, wherein the first substrate comprises a plurality of the base layers and a plurality of the conductive circuit layers, and the base layers and the conductive circuit layers are alternatively disposed with each other.

9. The electronic assembly according to claim 1, wherein the first conductive pad or the second conductive pad comprises a copper layer, a nickel layer and a gold layer stacked in sequence.

* * * * *